United States Patent [19]
Sekine

[11] Patent Number: 5,194,724
[45] Date of Patent: Mar. 16, 1993

[54] SOLID-STATE IMAGING DEVICE HAVING SIGNAL TRANSFERRING GROUPS FORMED OF A CCD REGISTER AND TWO PIXEL TRAINS

[75] Inventor: Hirokazu Sekine, Fujisawa, Japan

[73] Assignee: Kabushiki Kaisha Toshiba, Kawasaki, Japan

[21] Appl. No.: 883,373

[22] Filed: May 15, 1992

[30] Foreign Application Priority Data

May 17, 1991 [JP] Japan .................................. 1-113108

[51] Int. Cl.[5] ............................................ H01J 40/14
[52] U.S. Cl. .............................. 250/208.1; 358/213.29
[58] Field of Search ................. 250/208.1, 578, 211 J; 358/213.27, 213.28, 213.29

[56] References Cited

U.S. PATENT DOCUMENTS 4,447,735  5/1984  Horii .................................. 250/208.1
4,667,092  5/1987  Ishihara ............................ 250/208.1

Primary Examiner—David C. Nelms
Assistant Examiner—Que T. Le
Attorney, Agent, or Firm—Foley & Lardner

[57] ABSTRACT

A solid-state imaging device having a high resolution, comprises a plurality of pixels disposed in rows and columns each converting optical signals into signal charges; a vertical charge coupled device (CCD) register disposed between two pixel trains forming one group for transferring said signal charges; a first charge read-out element for reading out signal charges of each pixel disposed in one pixel train of two pixel trains and for transferring the signal charges to the vertical CCD register; a second charge read-out element for reading out signal charges of each pixel disposed in another pixel train of two pixel trains and for transferring the signal charges to the vertical CCD register; a charge storage element for separately storing signal charges which are separately transferred from respective pixel of each train of two pixel trains through the vertical CCD register; and a horizontal CCD register for transferring signal charges as one line unit, which are sequentially read out from the charge storage element in the order.

7 Claims, 3 Drawing Sheets

SOLID-STATE IMAGING DEVICE HAVING SIGNAL TRANSFERRING GROUPS FORMED OF A CCD REGISTER AND TWO PIXEL TRAINS

BACKGROUND OF THE INVENTION

The present invention relates to a solid-state imaging device, and more particularly, to a solid-state imaging device of a high-resolution type which is used in broadcasting video cameras and capable of promoting the high integration of elements in photosensitive region.

FIG. I shows an example of a construction of a conventional solid-state imaging device of a high resolution type which is used in broadcasting video cameras. The solid-state imaging device comprises a plurality of pixels 1 which are disposed in rows and columns, respectively, and for storing signal charges which are generated by light reception, vertical CCD (charge coupled device) registers 2 for transferring the signal charges which are generated and stored in the pixels 1, storage registers 3 which are disposed under the vertical CCD registers 2 and temporarily storing the signal charges, a horizontal CCD register 4 which is disposed near an undermost portion of the storage registers 3 and for transferring signal charges of one pixel line, and an output circuit 5 for externally outputting a voltage which is converted from the signal charges transferred from the horizontal CCD register 4. The solid-state imaging device is called an FIT (frame interline transfer) type which is well known from our prior Japanese application (see Japanese Patent official gazette of Laid-open Publication No. 55-52675-1980-).

Since a solid-state imaging device of the FIT type has the storage registers 3, this type device can increase a transfer speed of the vertical CCD register 2 in comparison with the further conventional solid-state imaging device of a conventional interline type, so that it is possible to have extremely improved smear characteristics. Accordingly, this type of device is used in broadcasting video cameras and certain types of personal use cameras.

In this conventional solid-state imaging device, one unit cell has pixels 1, charge read-out regions 6, vertical CCD register 2, and an element separating region 7, as shown in FIG. 2, and a pitch $P_H$ in the horizontal direction is the sum of widths of the pixel 1, the register 2 and the distances between pixels 1 and register 2. Namely, the pitch $P_H$ is represented by the equation of "$P_H = L_1 + L_2 + L_3 + L_4$".

Furthermore, a pitch $P_V$ in the vertical direction is the sum of the widths $W_1$ and $W_2$ of the pixel 1 and the element separating region. That is, the pitch $P_V$ is represented by the equation of "$P_V = W_1 + W_2$".

As understood from the construction shown in FIG. 2, the pitch size in the horizontal direction is substantially the same as the size in the vertical direction in spite of providing the charge read-out region 6 between the pixel 1 and the vertical CCD register 2. Accordingly, it is difficult to integrate the circuit in the horizontal direction, so that the pitch size in the horizontal direction determines the upper limit o the number of the pixels. In accordance with increased pixels in the future, a high integration in the horizontal direction is required by means of the increase of the pixels in the horizontal direction because it is impossible to increase the pixel number in the vertical direction which is determined by the number of the horizontal scanning lines such as 525 lines in an NTSC system, 1125 lines in a high-vision and the like. However, high integration in the horizontal direction is difficult in comparison the high integration in the vertical direction as described above, and becomes a problem in that forcible integration results in the deterioration of the smear characteristics and sensitivity.

SUMMARY OF THE INVENTION

In view of the above conditions, an object of the present invention is to provide a solid-state imaging device capable of improving a degree of an integration without the deterioration of the smear characteristics and the sensitivity.

A solid-state imaging device according to the present invention comprises a plurality of pixels which are disposed in rows and columns each for converting optical signals into signal charges, a vertical CCD register which is disposed between two pixel trains forming one group for transferring the signal charges, first charge read-out means for reading out signal charges of each pixel disposed in one pixel train of the two pixel trains and for transferring the signal charges to the vertical CCD register, second charge read-out means for reading out signal charges of each pixel disposed in another pixel train of the two pixel trains and for transferring the signal charges to the vertical CCD register, charge storage means for respectively storing the signal charges from the first charge read-out means and the signal charges from the second charge read-out means through the vertical CCD register one by one, a horizontal CCD for sequentially reading out and transferring signal charges of one pixel row from the signal charges which are stored by the charge storage means.

By the solid-state imaging device as described above, one vertical CCD register corresponds to two pixel trains. By this, it is possible to obtain a pitch in the horizontal direction smaller than the conventional device and without shortening the pixel width in the horizontal direction, thereby improving the degree of the integration without deteriorations of the smear characteristics and sensitivity.

Accordingly, the imaging device of the present invention can shorten the pitch width in the horizontal direction without the deterioration of the smear characteristics and sensitivity, thereby increasing the degree of the integration.

DETAILED DESCRIPTION OF THE PREFERRED EMBODIMENTS

Figure 1:
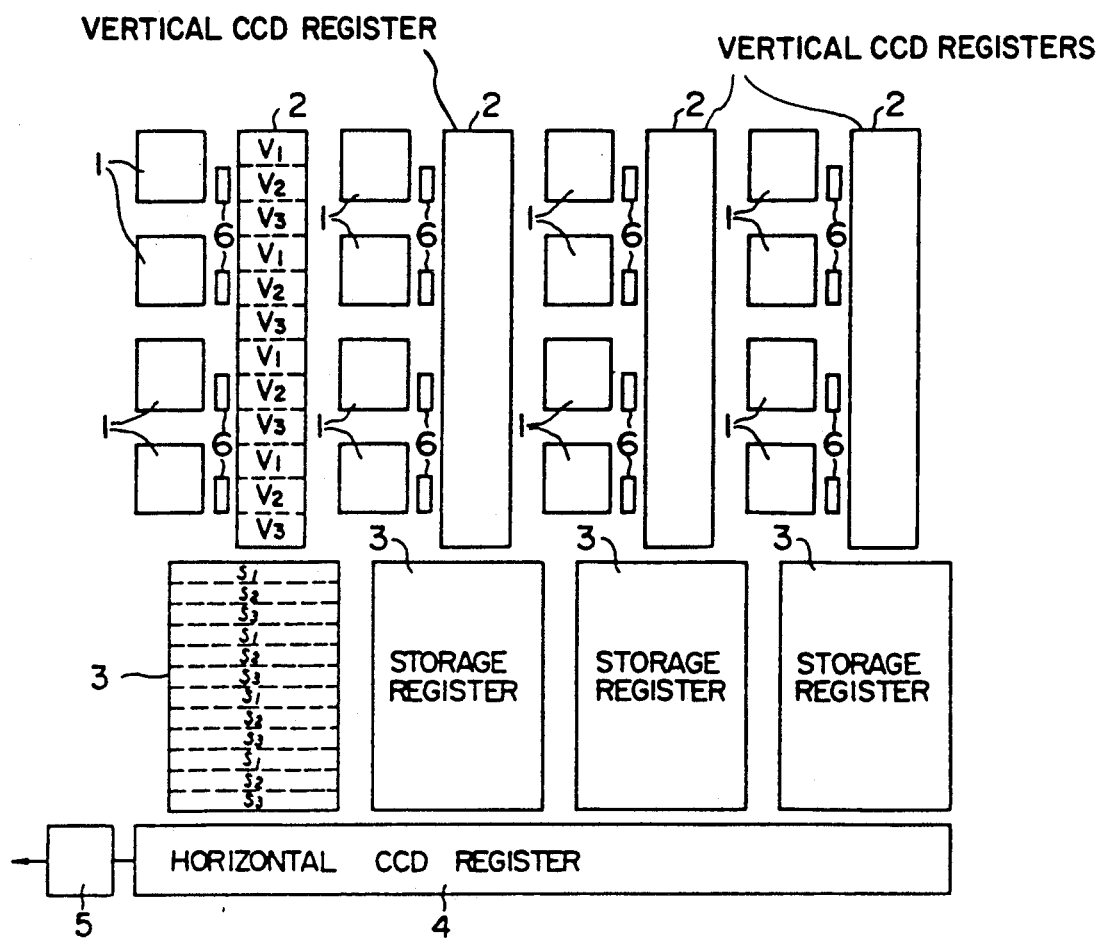
FIG. 1 is a block diagram showing a conventional solid-state imaging device.
Figure 2:
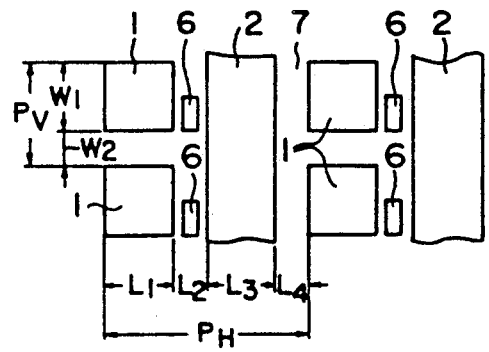
FIG. 2 is an explanatory diagram for explaining problems in the conventional device shown in FIG. 1.
Figure 3:
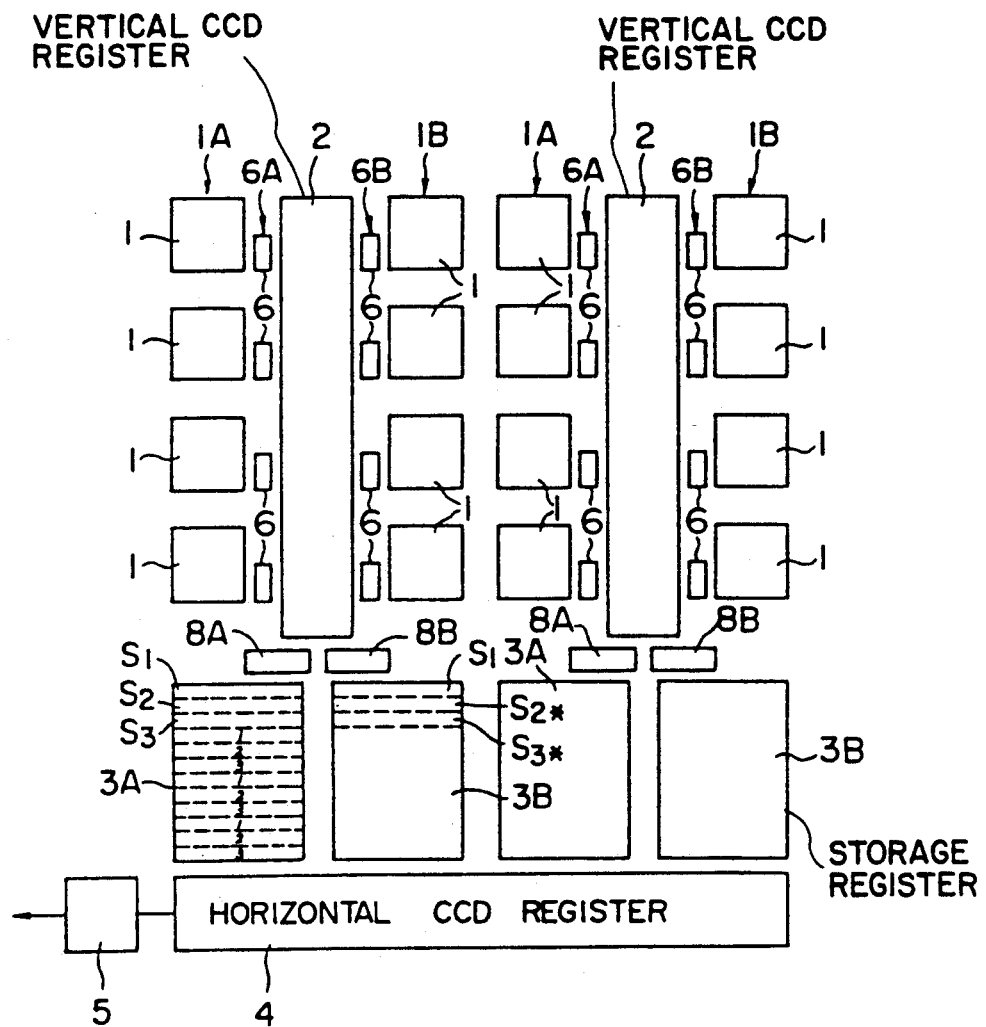
FIG. 3 is a block diagram showing a solid-state imaging device according to a first embodiment of the present invention.

FIG. 3 shows a construction of a solid-state imaging device according to a first embodiment of the present invention. The solid-state imaging device of the first embodiment comprises a plurality of pixels 1 which are disposed in rows and columns, a vertical CCD register 2, storage registers 3A and 3B, an output circuit 5, charge read-out regions 6A and 6B, and control gates 8A and 8B. The vertical CCD register 2 is provided between pixel trains 1A and 1B which form one pair. The pixel trains 1A and 1B are disposed in parallel to and respectively at both sides of the vertical CCD register 2. The first and second storage registers 3A and 3B are also disposed in parallel in the direction at right angles to the direction of the pixel trains 1A and 1B in the manner that one ends of both the registers 3A and 3B oppose to one ends of the pixel trains of one another, and the other ends of the registers 3A and 3B oppose to the horizontal CCD register 4. The charge read-out region 6A is provided between the pixel train 1A and the vertical CCD register 2, and the charge read-out region 6B is provided between the pixel train 1B and the vertical CCD register 2. The control gates 8A and 8B are provided between the vertical CCD register 2 and respective storage registers 3A and 3B.

The following is description of the operation of the solid-state imaging device of the first embodiment. Signal charges which are performed a photoelectric conversion by every pixels 1 in pixel train 1A, are read out by the charge read out region 6A to transfer the vertical CCD register 2. The transferred signal charge is further transferred through the vertical CCD register 2 and the control gate 8A to be stored in the storage register 3A. On the other hand, signal charges which have photoelectric conversion performed by every pixels 1 in pixel train 1B, are read out by the charge read out region 6B to transfer the vertical CCD register 2. The transferred signal charge is further transferred through the vertical CCD register 2 and the control gate 8B to be stored in the storage register 3B. At this time, the signal charges of the pixel train 1A are stored in the storage register 3A. Next, the horizontal CCD register 4 reads out one by one the signal charges of one pixel line from the signal charges stored in the storage register 3A and 3B to transfer them to the output circuit 5. The output circuit 5 converts the voltage of the signal charges to output them to external.

In this device according to the first embodiment, since the one vertical CCD register 2 corresponds to two lines of the pixel trains 1A and 1B, the pitch in the horizontal direction can be smaller than the conventional device without shortening the horizontal size of each pixel, thereby improving the degree of integration.

Figure 4:
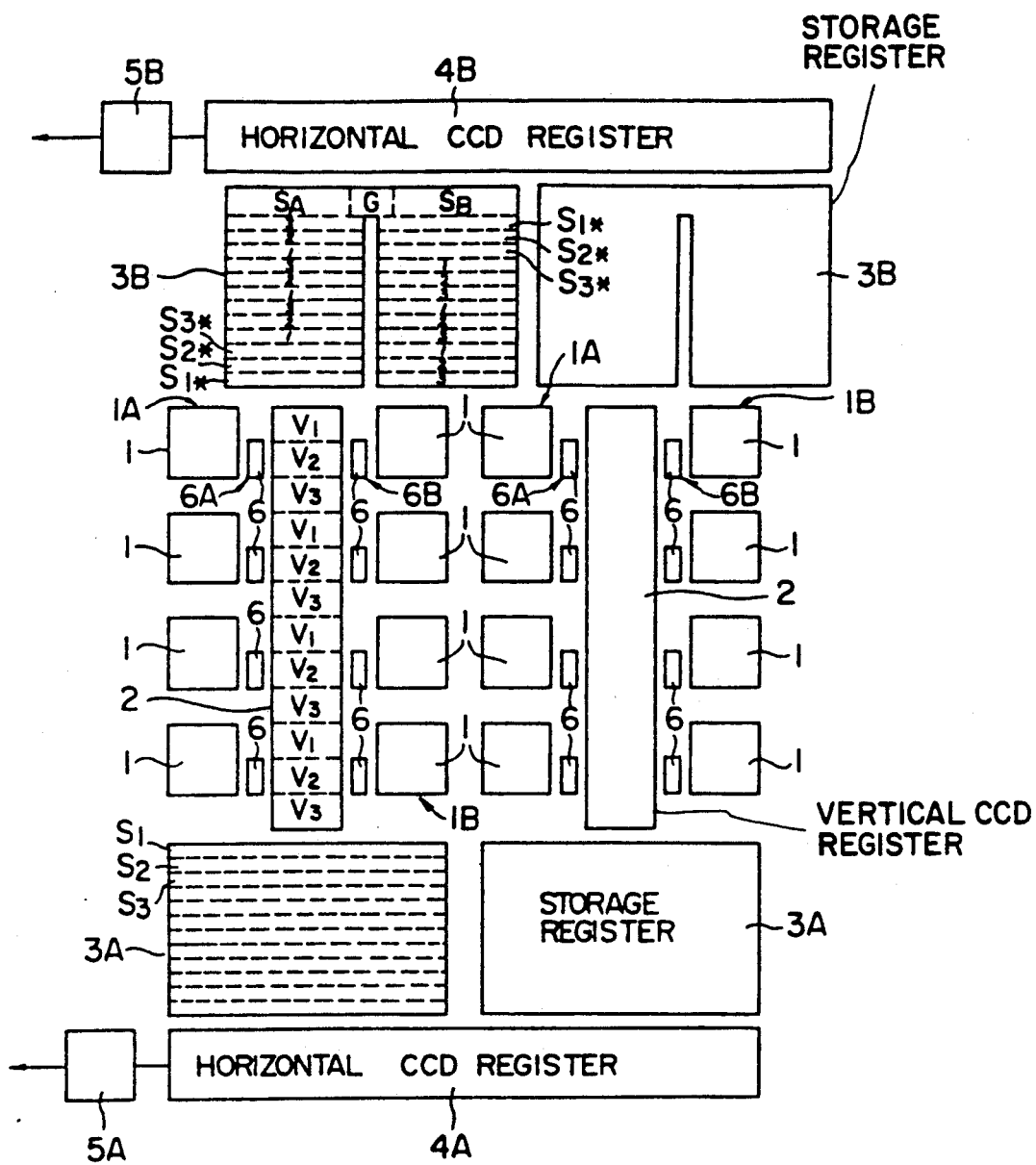
FIG. 4 is a block diagram showing a solid-state imaging device according to a second embodiment of the present invention.

Next, FIG. 4 shows a solid-state imaging device according to a second embodiment of the present invention. The imaging device of the second embodiment has the storage register 3B which is disposed to have one transfer terminal of the vertical CCD register 2 opposite to another transfer terminal with respect to the storage register 3A. Furthermore, vertical CCD registers 4A and 4B are provided in place of the vertical CCD register 4 of the first embodiment and output circuits 5A and 5B are provided in place of the output circuit 5 of the first embodiment. Signal charges of the pixel trains 1A and 1B are transferred through the vertical CCD register 2 to the storage registers 3A and 3B in the same manner of the first embodiment. However, the differences with the first embodiment reside in that signal charges stored in the storage register 3A are outputted through the horizontal CCD register 4A and the output circuit 5A, and signal charges stored in the storage register 3B are outputted through the horizontal CCD register 4B and the output circuit 5B. Since the storage register 3B is disposed at a position opposite to the storage register 3A, the signal charges which is are transferred from the pixel train 1B to the storage register 3B, need to have a transfer order opposite to a storage order in transferring them to the horizontal CCD register 4B by turning over the order of signal charges $S_A$ to be in the order of signal charges $S_B$ in the storage register 3B.

In this second embodiment, the horizontal CCD register is comprised of a first and a second horizontal CCD registers A and 4B which are respectively provided in the direction at right angles to the direction of arrangement of one and another pixel trains and along the both ends of the pixel trains 1A and 1B. Furthermore, the first storage register 3A is provided between the first horizontal CCD register 4A and the vertical CCD register 2 in order to store one by one the signal charges of each pixel of the pixel train 1A, and the second storage register 3B is provided between the second horizontal CCD register 4B and the vertical CCD register 2 in order to store one by one the signal charges of each pixel of the second pixel train 1B.

The second storage register 3B has a provisional storage region $S_A$ and a final storage region $S_B$. The provisional storage region $S_A$ stores signal charges of each pixel of the second pixel train 1B in the order that the vertical CCD register 2 transfers the signal charges of second pixel train 1B, and has the storage order opposite the charge transfer direction of the first storage register 3A. The final storage region $S_B$ stores signal charges of the second pixel train 1B in the same direction as the charge transfer direction of the first storage register 3A by converting the storage order of the signal charges in the provisional storage region $S_A$.

Accordingly, the solid-state imaging device of the second embodiment has the same effect as the device of the first embodiment.

What is claimed is:

1. A solid-state imaging device having a high resolution, comprising
    a plurality of pixels disposed in rows and columns each converting optical signals into signal charges;
    a vertical charge coupled device (CCD) register disposed between two pixel trains forming one group for transferring said signal charges;
    first charge read-out means for reading out signal charges of each pixel disposed in one pixel train of said two pixel trains and for transferring the signal charges to said vertical CCD register;
    second charge read-out means for reading out signal charges of each pixel disposed in another pixel train of said two pixel trains and for transferring the signal charges to said vertical CCD register;
    charge storage means for separately storing signal charges which are separately transferred from respective pixel of each train of said two pixel trains through said vertical CCD register; and
    a horizontal CCD register for transferring signal charges as one line unit, which are sequentially read out from said charge storage means in the order.

2. The solid-state imaging device according to claim 1, wherein
    said charge storage means comprises a first storage register which sequentially stores signal charges of each pixel, which are read out from said one pixel train by said first charge read-out means, and a second storage register which sequentially stores signal charges of each pixel, which are read out from said another pixel train by said second charge read-out means.

3. The solid-state imaging device according to claim 2, wherein
said first and second registers are disposed in parallel in the direction at right angles to the direction of the pixel trains in the manner that one ends of both the registers oppose to one ends of said two pixel trains of one and another, and the other ends of said two registers oppose to said horizontal CCD register.

4. The solid-state imaging device according to claim 3, wherein
a first transfer control gate is provided between said vertical CCD register and said first storage register in order to transfer one by one said signal charges of every pixels of said one pixel train to said first storage register, and a second transfer control gate is provided between said vertical CCD register and said second storage register in order to transfer one by one said signal charges of every pixels of said one pixel train of said second storage register.

5. The solid-state imaging device according to claim 3, wherein
said first and second storage registers respectively have storage regions which are disposed in the order corresponding to arrangements of said pixels in said one and another pixel trains, respectively, and said signal charges of each pixel which are transferred through one side of said respective storage register are transferred through another side of said storage register to said horizontal CCD register after temporarily stored in said storage regions.

6. The solid-state imaging device according to claim 2, wherein
said horizontal CCD register is comprised of a first and a second horizontal CCD registers which are respectively provided in the direction at right angles to the direction of arrangement of said one and another pixel trains and along said both ends of said pixel trains; and
a first storage register is provided between said first horizontal CCD register and said vertical CCD register in order to store one by one said signal charges of each pixel of said one pixel train, and a second storage register is provided between said second horizontal CCD register and said vertical CCD register in order to store one by one said signal charges of each pixel of said another pixel train.

7. The solid-state imaging device according to claim 6, wherein
said second storage register has a provisional storage region and a final storage region,
said provisional storage region stores signal charges of each pixel of said another pixel train in the order that said vertical CCD register transfers said signal charges of said another pixel train, and has the storage order opposite the charge transfer direction of said first storage register, and
said final storage region stores signal charges of said another pixel train in the same direction as the charge transfer direction of said first storage register by converting the storage order of said signal charges in said provisional storage region.

* * * * *